US006426860B1

(12) United States Patent
Schubert et al.

(10) Patent No.: US 6,426,860 B1
(45) Date of Patent: Jul. 30, 2002

(54) HOLDING DEVICE FOR A SUBSTRATE

(75) Inventors: Gerhard Schubert, Jena; Ulf-Carsten Kirschstein, Jena-Priessnitz; Stefan Risse, Jena; Gerd Harnisch, Jena; Gerhard Kalkowski, Jena; Volker Guyenot, Jena, all of (DE)

(73) Assignee: Leica Microsystems Lithography GmbH, Jena (DE)

( * ) Notice: Subject to any disclaimer, the term of this patent is extended or adjusted under 35 U.S.C. 154(b) by 0 days.

(21) Appl. No.: 09/600,630

(22) PCT Filed: Nov. 16, 1999

(86) PCT No.: PCT/DE99/03638

§ 371 (c)(1),
(2), (4) Date: Sep. 19, 2000

(87) PCT Pub. No.: WO00/31774

PCT Pub. Date: Jun. 2, 2000

(30) Foreign Application Priority Data

Nov. 20, 1998  (DE) ......................................... 198 53 588

(51) Int. Cl.[7] .............................................. H01G 23/00
(52) U.S. Cl. ...................................... 361/234; 361/115
(58) Field of Search .................................. 361/234, 115

(56) References Cited

U.S. PATENT DOCUMENTS

| 5,172,402 A | * 12/1992 | Mizusawa et al. ............ 378/34 |
| 5,535,090 A | 7/1996 | Sherman ..................... 361/234 |
| 5,600,530 A | 2/1997 | Smith .......................... 361/234 |
| 5,644,137 A | 7/1997 | Waggener et al. ......... 250/492.2 |
| 5,825,470 A | 10/1998 | Miyai et al. .................... 355/72 |
| 6,141,108 A | * 10/2000 | Kida et al. ................... 356/401 |

FOREIGN PATENT DOCUMENTS

| EP | 0 486 966 | 5/1992 | .......... H02N/13/00 |

OTHER PUBLICATIONS

Sherman et al.; "Sapphire Electrostatic End Effectors for Vacuum Wafer Handlers"; Semiconductor International; vol. 20, No. 8; Jul. 1997; pp. 319–322.

* cited by examiner

Primary Examiner—Stephen W. Jackson
(74) Attorney, Agent, or Firm—Foley & Lardner

(57) ABSTRACT

The present invention provides for a device for holding a substrate in an exposure system. In the exposure system, the substrate is positioned on a table movable in the X and Y coordinates of an X, Y plane, and the exposure system provides a metering assembly between a table surface and the substrate to adjust the distance and to align the substrate in relation to an exposure optics, from where a corpuscular radiation is directed right-angled onto a substrate surface, corresponding to the Z coordinate. The device for holding the substrate includes two mounting plates aligned parallel to the X, Y plane, adjusted upon the table in a direction to the exposure optics and with different distances to the table surface, the first mounting plate of which being directly connected to the table. The second mounting plate is connected with the first mounting plate through at least one holding device, and has a bearing plane for the substrate being designed on that side of the second mounting plate turned to the exposure optics.

16 Claims, 3 Drawing Sheets

HOLDING DEVICE FOR A SUBSTRATE

CROSS REFERENCE TO RELATED APPLICATIONS

This invention claims priority of a German filed patent application DE P 198 53 588.0.

FIELD OF THE INVENTION

This invention relates to a device to hold a substrate inside an exposure system in which the substrate is seated on a table traveling in the X, Y coordinates and where, between table surface and substrate, metering means for adjusting the distance and for aligning the substrate in relation to an exposure optics are provided, from where a particle radiation is directed rectangular to the substrate surface, corresponding to the Z coordinate.

BACKGROUND OF THE INVENTION

Holding devices for mounting substrates, especially for masks and wafers during exposure in optical, as well as in electro-optical exposure systems, are known to exist in different versions in the state of the art. As a rule, holding systems are arranged on a table movable in two coordinates X, Y, and have a supporting plane for the substrate on which it is seated and held prior to the exposure process while the table will be gradually moved parallel to X and/or Y, thus being adjusted to the requested exposure positions in succession. The bearing planes are mostly formed by high plane bearing surfaces, and also partially by multiple point-shaped bearing elements.

The basic bodies, mounting plates etc, on which the bearing elements are arranged or bearing surfaces are formed, are normally mechanically fixed to the table, using metering means to adjust the substrate in the Z coordinate. In this context the Z coordinate corresponds to the radiation direction of the exposure ray path and is directed rectangular to the substrate surface.

The positioning accuracy of the substrate surface, the adjustment of the bearing plane, the flatness of a bearing plane and last but not least the stability of shape of all parts and assemblies of the holding system are of essential importance for the quality and fineness gaining the structure demanded during exposure. This is the more important the more the industry of microelectronics aims at further reducing the width of structure.

For this reason an appropriate design of the holding systems have to secure accuracy in respect to dimensional and shape stability even under the influence of changes in temperature and pressure during the process of exposure. Another factor to be paid attention to with regard to the design of holding systems is, that the exposure radiation will not be affected by magnetic fields originating from magnetic components or from materials containing magnetic particles. Additionally the exposure radiation must not be deviated unintentionally by electrical chargings of the holding system. Moreover, mechanical forces, no matter of what origin, must not influence the substrate via parts or assemblies, which could cause deformations and thus inaccuracies. Besides, the costs for producing the holding device have to be kept in economically reasonable limits.

The holding systems available so far in the state of the art have to be evaluated under this very aspect of these high requirements. For example, a device for holding substrates is known from the U.S. Pat. No. 5,535,090 as well as from the publication "Semiconductor International", Sherman, Volume 20, No. 8, p. 319–322, having an electrostatic Chuck arrangement. Chuck arrangements have electrically conductive layers to which, through supply contacts, disconnectable electrical potentials can be applied in relation to the substrates. The application generates an electrostatic field by which the substrate is kept electrostatically on an even insulation layer placed above the conductive layer. In this context the amount of the force of attraction between the Chuck arrangement and the substrate depends on the electrical voltage fed, the area size of the conductive layer (the so-called Chuck electrode) and the thickness of the insulation layer between the conductive layer and substrate.

In case of the arrangement mentioned above, sapphire is provided to be the bearing material for the substrate. Here the whole 8" inch bearing surface was not covered by sapphire but through an intermediate layer made of niobium, only several 2 inch sapphire discs are provided which form the bearing surface for the substrate. The lavish manufacturing process of the bearing surface consisting of multiple sapphire areas is disadvantageous in this context, which, in addition to the expensive sapphire material itself, causes high cost.

The U.S. Pat. No. 5,600,530 describes another holding device for substrates, which again is equipped with an electrostatic Chuck arrangement. But here aluminum oxide is used as material for the insulation layer. At the same time a procedure is mentioned by which the aluminum oxide layer is brought to the necessary thickness for positioning the substrate by thinning down.

The use of aluminum oxide implies disadvantageous problems caused by an unfavorable temperature expansion coefficient. For this reason the use of aluminum oxide inevitably requires measures to compensate this disadvantage and to prevent changes in position and/or shape of the substrate exceeding a permissible measure. The solution to this problem, however, is not given in the paper mentioned.

Another essential disadvantage of the known state of the art is that holding systems for substrates are always only designed for substrates of a given size. For the exposure of individual substrates or series of substrates of different seizes the known holding systems can be used to a certain extent only or not at all, unless under the condition of a high expenditure of assembly and adjustment.

Another holding device for substrates for processing in an electron-beam facility is revealed in U.S. Pat. No. 5,644,137. This arrangement is equipped with interferometers to determine and monitor the position of the table and the substrate when moving the X and Y coordinates. In this case, a stabilization of the position of the substrate in relation to the exposure optics is reached insofar as some parts of the holding device and the interferometers are made of material having the same expansion behavior, resulting in a higher degree of positioning precision in the X and Y directions. This publication, however, does not show how the problems, with regard to the expansion in the Z coordinate and the thus related inaccuracies, can be solved.

SUMMARY OF THE INVENTION

Taking this into consideration the invention is intended for further improvement of a holding device of the kind, described above in such a way that bearing elements for the substrate are interchangeable with each other in a quick and uncomplicated manner with yet reaching a high degree of positioning precision.

According to the invention this task is solved by two mounting plates adjusted on the table parallel to the X, Y plane, being also directed to the exposure optics and in various distances to the table surface. The first one of the mounting plates is being connected directly to the table, the second mounting plate being in connection with the first mounting plate through at least one holding device, the holding function of which can be switched on and off, with a mounting plane for substrates being designed on that side turned to the exposure optics.

This implies the advantage that the second mounting plate provided with the bearing plane for the substrate can be detached from the first mounting plate after switching off the holding function, enabling in an easy and uncomplicated way an exchange among mounting plates with bearing planes for substrates having different sizes. Due to the parallel alignment of both mounting plates to each other and the design of reference surfaces at both mounting plates and the holding devices, an exact exposure position for the substrate is secured after every exchange.

The preferred designs of the invention provide that the first mounting plate is connected to the table through anti-vibration elements, and that the switchable holding devices, designed to hold the second mounting plate to the first, are also designed to be spacer blocks through which the mounting plates are separated by a given distance parallel to the Z coordinate, creating a space between the two mounting plates. For example, a lifting device connected to a robot arm can be inserted into this space so that the second mounting plate can be taken out or exchanged for another mounting plate having a different size of the bearing plane.

According to the arrangement of the invention an advantageous construction can be reached through which different reference planes can be assigned to the individual mounting plates, thus at the same time creating an essential precondition to enable the arrangement of separate holding devices respectively parts on each mounting plate and these holding devices respectively parts are subjected to specific requirements with regard to stability in dimension and material features, so that even under extreme influences caused by temperature, pressure or mechanical forces a highly precise exposure of the substrate is secured.

For example one design of the invention can provide that at least the second mounting plate, on which the bearing plane for the substrate is formed, with regard to its material features, its dimension and its shaping is designed in such a way that forces caused e.g. by material expansions due to changes in temperature or mechanical shocks being of such an extent that they could cause a deformation of the substrate exceeding a permissible measure, can not be transferred to the substrate. In this respect the invention provides such a brittle material for manufacturing the mounting plates that does not allow a plastic deformation caused by the influence of forces.

This surely guarantees that the substrate cannot deform neither before nor during the exposure process to a degree that would imply inaccuracies during exposure.

According to the invention the connection of the first mounting plate to the table can be realized by spacer elements which on one hand are firmly mechanically connected to the table surface, and on the other hand by elastic spacers which may consist of a fluorine elastomer that are coupled to the second mounting plate.

An especially preferred design of the invention provides electrostatic Chuck arrangements as holding devices between the two mounting plates. These consist each of a basic body made of an electrically non-conductive material on which an electrically conductive layer, for instance nickel or chromium, followed by an insulation layer above, is arranged. The electrically conductive layer can be advantageously divided in respect of its plane extension into individual segments with each segment being possible to be connectable separately to an electrical potential.

Here, the surfaces of the insulation layer turned to the exposure optics are designed as bearing surfaces for the second mounting plate. Besides the holding function for the second mounting plate, these Chuck arrangements also function to form a reference plane to align the second mounting plate and thus the substrate which is arranged upon the second mounting plate as depicted.

In one design of the invented holding device the bearing plane for the substrate consists of three balls that are held on the second mounting plate by cages for instance, or are glued to the second mounting plate. These balls may be arranged on a graduated circle radially-symmetric, forming a three-point bearing for the substrate. As an alternative it can, however, also be provided that there are one or more electrostatic Chuck arrangements arranged on the second mounting plate (in addition to the Chuck arrangements serving to hold the second mounting plate) where a bearing plane for the substrate is modeled, designed to hold the substrate to the second mounting plate electrostatically. Here the basic body is connected to the second mounting plate, for instance by wringing or gluing.

In case of all Chuck arrangements the electrically conductive layer has contacts. To generate the electrostatic forces, an electrical potential is fed to the electrically conductive layer of the respective Chuck arrangement on one hand and to the assembly (the second mounting plate) put on the insulation layer respectively to the part laid on (substrate) on the other hand.

An especially preferred design of the invention provides that the second mounting plate and also the basic body and insulation layers of the Chuck arrangements are made of a magnet-free glass-ceramics with a temperature expansion coefficient—$\alpha_7 = 0 \pm 0,05 * 10^{-6} K^{-1}$—and an elastic module of $E \approx 90,6$ GPa. Such a glass-ceramics is available on the market under the name "ZERODUR".

The use of this material enables a construction that is extremely insensitive to changes in temperature. Influences of temperature inside the exposure system can hardly be avoided during the exposure process; they may result from thermal conduction and/or thermal radiation from within the system, but can also be effected by exposing the substrate. The construction suggested, however, allows reducing the negative implications of disturbing influences of temperature to such a degree that the expenditure spent on stabilizing the temperature within the exposure system respectively near the substrates can be reduced to a minimum.

Another advantage is that the glass-ceramics used can be processed effectively by conventional optical processing technologies securing the highest level of dimensional stability. This especially concerns the production of even planes, but also the keeping of parallelisms and angles. This thus enables the keeping of process tolerances in the micrometer range and in the range of angular seconds. Due to the brittleness of the glass-ceramics, plastic deformations on the even planes are prevented. As described above, this avoids an uncontrolled deformation of the substrate.

Another essential advantage is that traditional technologies can be used to deposit coatings onto parts made of glass-ceramics. Such coatings may be reflecting layers, for instance for interferometer mirrors, or electrically conductive layers serving to feed an electrical potential. The latter serves to avoid electrostatic charge on undesirable spots which otherwise might occur when during the exposure electrically charged particles hit insulating surfaces. To this layer the electrical potential to generate the electrostatic Chuck supporting forces between the first and the second mounting plate can be fed.

Since the glass-ceramics used is magnet-free, it is secured that the exposure beam path cannot be affected by magnetic fields, which may originate from parts made of metallic materials or from materials interspersed by magnetic particles.

To generate the electrostatic forces an electrical potential of up to 5,000 Volts is provided. The potential is switchable by means of which the supporting forces can be switched on and off as required.

It is planned for a very preferred design of the invention to have three Chuck arrangements, each having cylindrical basic bodies fixed to the first mounting plate, forming a mutual bearing surface for the second mounting plate. For example, the Chuck arrangements can be positioned radially symmetric to each other on a graduated circle. Their dimensions in direction to the Z coordinate and their distances to each other in the X and Y coordinates are designed in such a way that there is enough space left between the Chuck arrangements and between the first and second mounting plates to insert a lifting tool arrangements and between the first and second mounting plates to insert a lifting tool connected to a robot arm, to grab under the second mounting plate, to lift it off the bearing surface, to take it from the exposure system, and to replace it with a mounting plate designed to receive a substrate of a differing size.

Additionally the holding device for the substrate described can be equipped with a metrology system serving to determine and to monitor the position of the substrate in the x and y coordinates during exposure and having two mirrors adjusted to each other orthogonally serving as reference for an interferometric measuring set-up. According to the invention both mirrors can be placed either directly upon the first mounting plate or upon intermediate locks that are connected to the first mounting plate. In case of the latter, the intermediate locks serve as spacers to adjust the positions of the mirrors in direction to the Z coordinate.

In this case, too, the connection between mounting plate, intermediate locks and basic body of the mirrors can be effected by wringing or gluing. This is also advantageous, if the mirrors are made of the same glass-ceramics as mentioned above, resulting in a uniform expansion behavior of the respective parts or assemblies by temperature influence. To realize the mirror surfaces, coatings with a high reflection factor can be deposited onto the basic bodies of the mirrors, for instance made of aluminum coated with an oxide protective layer.

With regard to the mirrors it is, of course, quite possible to think of a design where the mirrors adjusted orthogonal to each other are modeled in L-figure in single piece mode and are also either directly fastened to the first mounting plate or through intermediate locks.

BRIEF DESCRIPTION OF THE DRAWINGS

The subject matter of the invention is described with reference to the embodiments shown in the drawings.

DETAILED DESCRIPTION OF THE INVENTION

Figure 1:
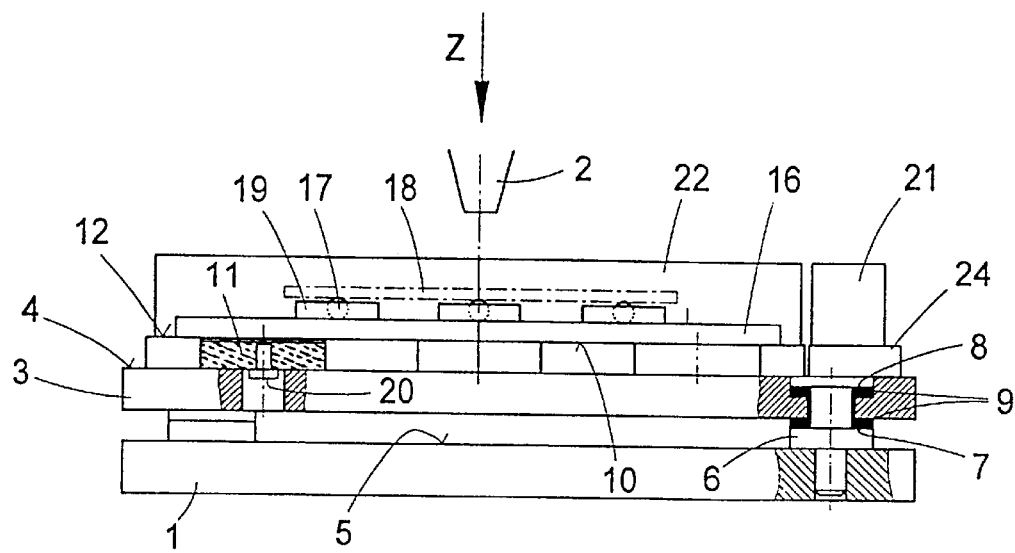
FIG. 1 shows the building-up principle of the arrangement of the invention with a three-point bearing for the substrate.

FIG. 1 depicts a table 1 that is movable along the X and Y coordinates in relation to an exposure optic 2. With exposure optics (2) for instance it concerns to an electron-optical exposure system from which the exposure radiation is directed rectangular to the table, following the Z coordinate.

At first a first mounting plate 3 is arranged on table 1 directed to the exposure optics 2. The surface of the mounting plate 3 turned to the exposure optics 2 is designed to be a first reference surface 4. For this purpose this surface is designed high-plane and adjusted exactly parallel to the level stretched by the X, Y coordinates.

The mounting plate 3 is connected mechanically to the table 1 through fixing elements 6, which, on the table surface 5, can be pressed or screwed into the table 1, for instance. The connection between the fixing elements 6 and the mounting plate 3 is carried out in such a way that ring-shaped widenings 7, 8, corresponding to each other, and placed at there fixing elements 6 as well as to the mounting plate 3, are opposed to each other. In this case, attenuation elements 9 made of a fluorine elastomer are arranged between the opposed ring-shaped widenings 7, 8 which serve to reduce or prevent the transmission of vibrations, shocks and/or deformations from the table 1 to the mounting plate 3.

On the reference surface 4, three electrostatic Chuck arrangements 11 are arranged, having a circular cross section. The surfaces of the three Chuck arrangements 11 turned towards to the exposure optics 2 form together a second reference surface 12 and a bearing plane for a second mounting plate 16 at the same time.

Figure 5:
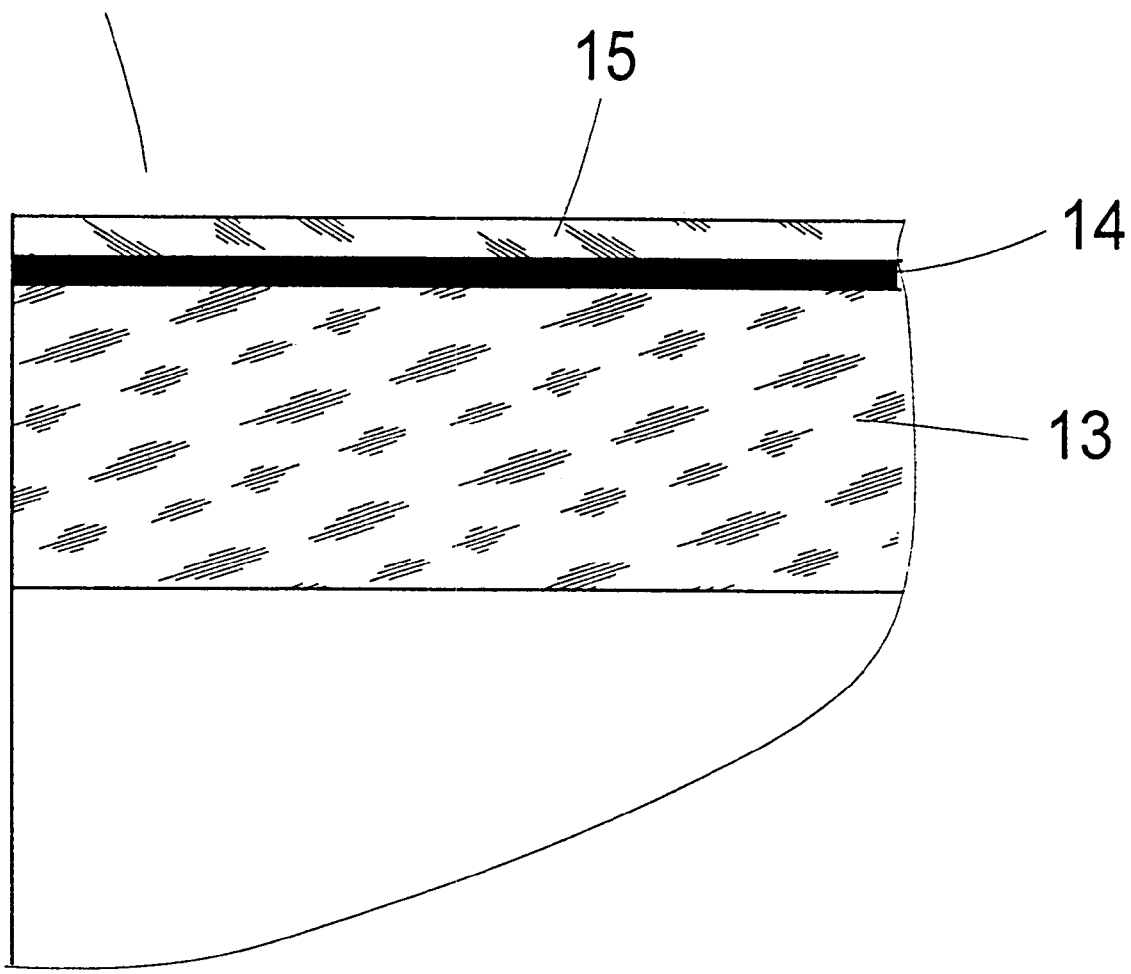
FIG. 5 shows the building-up principle of an electrostatic Chuck arrangement.

Each of the Chuck arrangements 11 has, as depicted in FIG. 5, a basic body 13 on which in direction to the exposure optics 2, an electrically conductive layer 14 made of chromium or nickel with an insulation layer 15 above is deposited. Here, the electrically conductive layer 14 can be deposited in form of several, electrically separated segments so that different electrical potentials can be fed to each single element.

According to the invention, the basic bodies 13 as well as the insulation layers 15 of the Chuck arrangements 11 are made of a class-ceramics with the same properties by which differences in the expansion behavior are limited to a minimum respectively by which the accuracy of the reference surface 12 remains stable even in case of the temperature effects. Here the advantageous "ZERODUR" type glass-ceramics already described above is provided.

On the upper side of the mounting plate 16, that is on the surface turned to the exposure optics 2, three balls 17, forming a three-point bearing, are arranged as bearing elements for the substrate 18. The balls 17 are kept in position by cages 19 which are glued onto the mounting plate 16 (see FIG. 2).

The mounting plate 16 and the balls 17 are advantageously made of the same glass ceramics like the basic bodies 13 and the insulation layers 15. Thus the parts serving as metering means in the Z coordinate above the first reference surface 4, are made of the same material.

Here advantages do not only result with regard to the temperature expansion behavior by which changes in temperature are compensated to a great extent, but also by the fact that the class-ceramics is magnet-free and so the exposure beam path cannot be affected by magnetic fields, originating from the material used. Besides that, no turbulent flows occur in the glass-ceramics, which could unintentionally influence the exposure beam path through an accompanying magnetic field.

The mounting plate 16 is coated with a layer 10 made of electrically conductive material. If an electrical potential of for instance 3,000 Volts is fed to the layer 10 on one hand and to the conductive layers 14 of the Chuck arrangements 11 on the other hand, electrostatic forces are generated, by which the mounting plate 16 is kept in the very position on the mounting plate 3 as depicted in FIG. 1.

To contact the electrically conductive layers 14, electricity supplies 20 are led through the basic bodies 13 of the Chuck arrangements 11. The potential can be switched on and off by a switch (not shown) so that the electrostatic forces are cancelled after switching off power and then the mounting plate 16, together with the bearing elements for the substrate 18, can be taken off the Chuck arrangements 11. This enables an exchange of the mounting plates 16 at any time, and mounting plates for substrates of varying sizes can be easily counter-exchanged.

Additionally two mirrors 21, 22 for example are provided on the mounting plate 3, each of which being placed at a space to the reference plane 12 through an intermediate lock 24 or 25, respectively. The mirrors 21 and 22 serve as reference mirrors for a laser-measuring system, which is not described in further detail here. In this context each of the mirrors 21, 22 is assigned to one of the X or Y coordinates, they are thus adjusted orthogonal to each other. They consist of a basic body made of glass-ceramics, which, in the measuring direction, is coated with a highly reflecting layer, for instance made of aluminum with an oxide layer.

Using the laser measuring system it is possible to detect the position of the table 1 and thus the position of the substrate 18 in the x and y coordinates during exposure and to control the next exposure position in accordance with the displacement of the table 1 and to correct it, if necessary.

Figure 2:
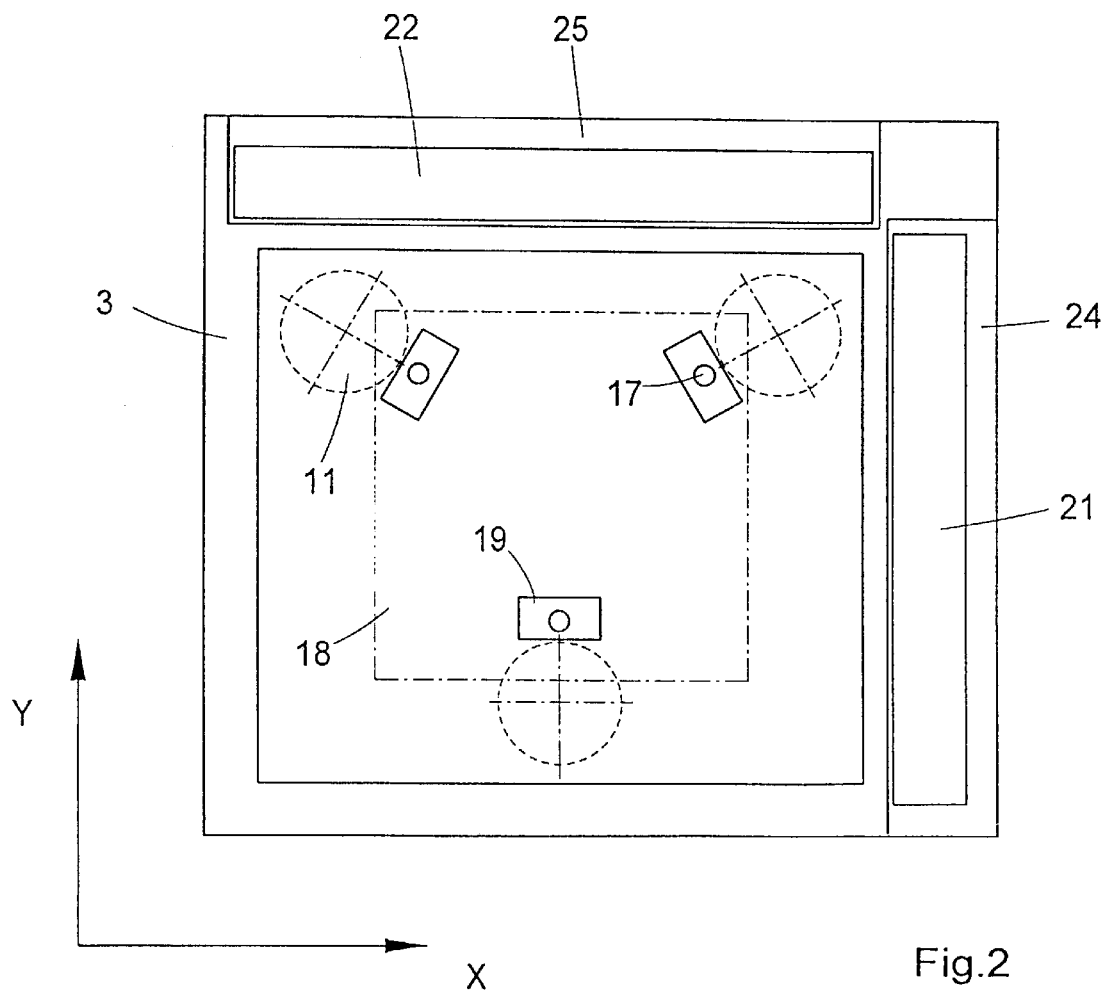
FIG. 2 shows a top view of FIG. 1.

FIG. 2 shows a top view of the arrangement according to FIG. 1. Here the orthogonal alignment of the two mirrors 21 and 22 can be seen as well as the positions of the Chuck arrangements 11 and of the balls 17 where the substrate 18 is placed.

Figure 3:
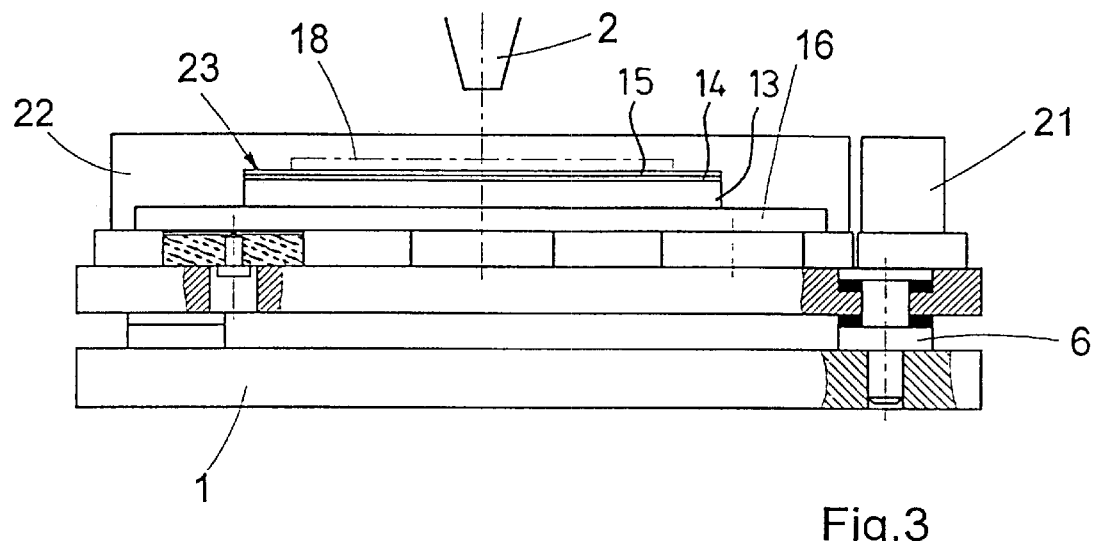
FIG. 3 shows the building-up principle of the arrangement of the invention with an electrostatic Chuck arrangement to receive a substrate.

Another design variation of the invention, which is depicted in FIG. 3 for instance, provides the construction above the table 1 in direction to the exposure optics 2 up to the mounting plate 16 similar to the preceding example. However, a three-point bearing consisting of three balls for the substrate 18 is not realized, as in design variation according to FIG. 1, but is replaced by another electrostatic Chuck arrangement 23.

The Chuck arrangement 23 is designed just like the Chuck arrangements 11 according to FIG. 5. That means, that an electrically conductive layer 14 is coated on a basic body 13 with an insulation layer 15 above. The insulation layer 15 is designed high-plane, so that the substrate 18 can be deposited on it and kept there according to its form. Here, in an analogous way the electrostatic holding forces are generated by an electrical potential being fed to the electrically conductive layer 14 on one hand and to the substrate 18 on the other hand. This potential can also be switched so that by switching on/off the substrate can be held or can be removed from the Chuck arrangement 23.

The electrostatic attractive force in this connection depends on the amount of voltage, the surface size of the Chuck arrangement 23 and on the thickness of the insulation layer 15. In order to enable an easy removal of the substrate from the Chuck surface respectively from the upper side of the insulation layer 15 it is advantageous when the outer surface respectively the bearing surface of the insulation layer 15 is designed in a surface profile of a depth in the $\mu$m range so that the substrate can be easily removed from the insulation layer 15 after clearing the potential.

Figure 4:
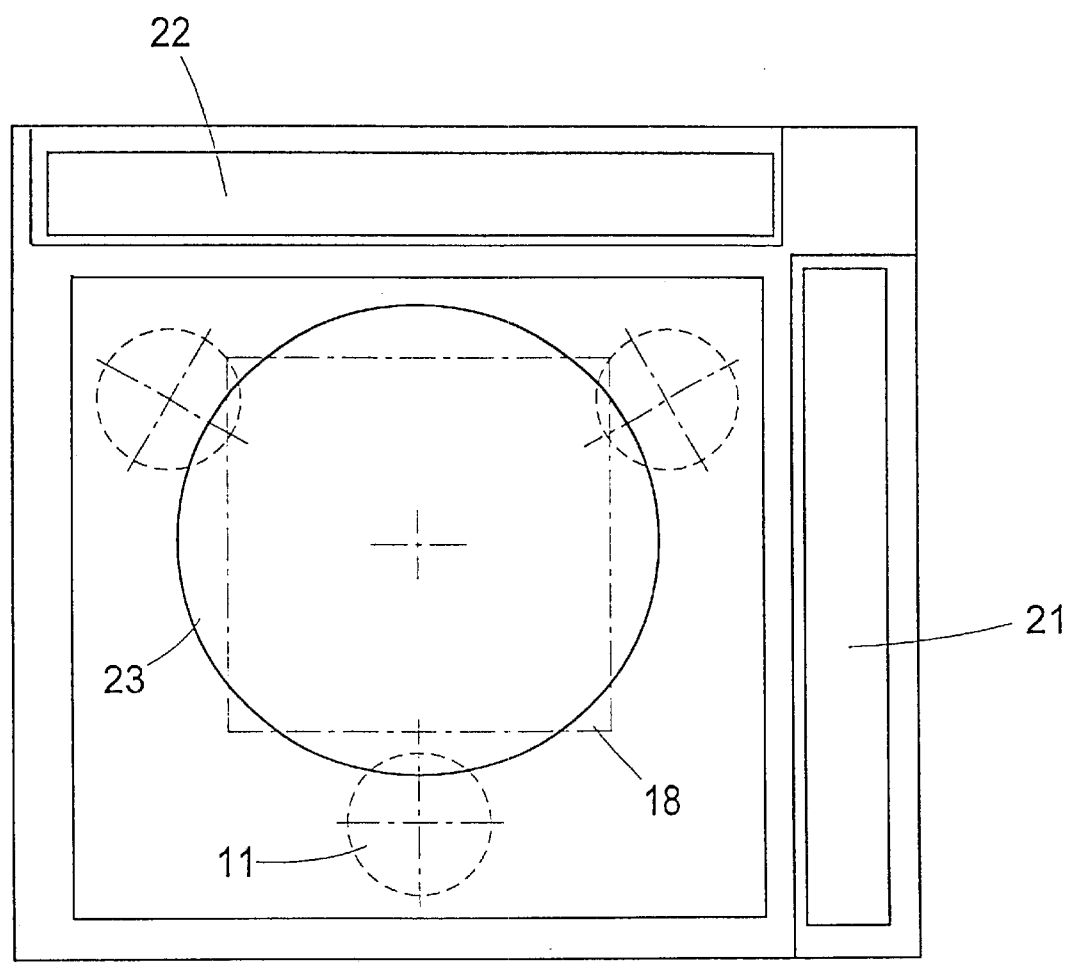
FIG. 4 shows a top view of FIG. 3.

In FIG. 4 it can be seen that the Chuck arrangement 23 is designed in a circular shape, and its diameter is approximately adapted to the dimensions of the substrate 18. Here again the positioning of the Chuck arrangement 11 by which the mounting plate 16 is supported can be noticed.

Finally one design variation of the invention provides that the surfaces of the parts made of glass-ceramics, at least those surface sections not having a function with regard to material-metering means in direction to the Z coordinate, are coated with an electrically conductive layer. This renders possible to avoid the electrostatic charging of parts at undesirable spots and thus an influence on the exposure beam path, which might result in inaccuracies during the exposure.

The invention has been described in detail with particular reference to certain preferred embodiments thereof, but it will be understood that variations and modifications can be effected within the spirit and scope of the invention.

PARTS LIST

1 Table
2 Exposure optics
3 First mounting plate
4 First reference plane
5 Table surface
6 Retaining device
7 Widening
8 Widening
9 Attenuation elements
10 Electrically conductive layer
11 Chuck arrangement
12 Second reference plane
13 Basic body
14 Electrically conductive layer
15 Insulation layer
16 Second mounting plate
17 Bearings
18 Substrate
19 Cages
20 Electricity supply
21, 22 Long mirrors
23 Chuck arrangement
24, 25 Intermediate lock

What is claimed is:

1. Device for holding a substrate in an exposure system in which the substrate is positioned on a table movable in the X and Y coordinates of an X, Y plane and which, between a table surface and the substrate, provides metering means to adjust the distance and to align the substrate in relation to an exposure optics, from where a corpuscular radiation is directed right-angled onto a substrate surface, corresponding to the Z coordinate, wherein two mounting plates aligned parallel to the X, Y plane are provided, adjusted upon the table in a direction to the exposure optics and with different distances to the table surface, the first mounting plate of which being directly connected to the table; and the second mounting plate being in connection with the first mounting plate through at least one holding device, and with a bearing plane for the substrate being designed on that side of the second mounting plate turned to the exposure optics.

2. Device according to claim 1, characterized in that at least one electrostatic Chuck arrangement (11) is provided as holding device on the first mounting plate (3), having a basic body (13) fixed to the mounting plate (3), an insulation layer (15) being a bearing plane for the second mounting plate (16), and an electrically conductive layer (14) arranged between the basic body (13) and the insulation layer (15).

3. Device according to claim 1, characterized in that at least one electrostatic Chuck arrangement (11) is designed as a spacer through which both mounting plates (3, 16) are positioned in a given distance in direction to the Z coordinate.

4. Device according to claim 1, characterized in that the first mounting plate (3) is connected to the table (1) by using anti-vibration elements (6).

5. Device according to claim 1, characterized in that the bearing plane for the substrate (18) designed at the second mounting plate (16) is formed by three balls (17), having a fixed position in cages (19).

6. Device according to claim 1, characterized in that on the plane of the second mounting plate (16) turned to the exposure optics, at least one electrostatic Chuck arrangement (23) is provided, having a basic body (13) fixed to the mounting plate (16), an insulation layer (15) being the bearing plane for the substrate (18), and an electrically conductive layer (14) arranged between the basic body (13) and the insulation layer (15).

7. Device according to claim 1, characterized in that the second mounting plate (16), the basic bodies (13) and the insulation layers (15) of the Chuck arrangements (11, 23) and the bearings (17) are manufactured from a glass ceramics with a temperature expansion coefficient of $\alpha_7 = 0 \pm 0,05 \ast 10^{-6} K^{-1}$ and an modulus of elasticity of $E \approx 90,6$ GPa.

8. Device according to claim 1, characterized in that on the first mounting plate (13), three cylindrical designed electrostatic Chuck arrangements (11) are provided and arranged on a graduated circle radially symmetric.

9. Device according to claim 1, characterized in that two mirrors adjusted mutually orthogonal (21, 22) to each other are provided for determining and monitoring the position of the substrate in respect of the X, Y coordinates.

10. Device according to claim 9, characterized in that the mirrors (21, 22) have basic bodies that are made of glass-ceramics, too, as indicated in claim 7, with the basic bodies surfaces provided to be the mirror surfaces are coated with an highly reflecting material.

11. Device according to claim 9, characterized in that the mirrors (21, 22) are preferably connected with the mounting plate (3) through intermediate locks (24, 25).

12. Device according to claim 1, characterized in that the surfaces of the parts and assemblies which do not serve as functional surfaces of a reference surface, are coated with an electrically conductive material and fed by an electrical potential.

13. Device according to claim 2, characterized in that the electrically conductive layer (14) is designed in form of several separately positioned segments between the basic body (13) and the insulation layer (15).

14. Device according to claim 1, wherein the holding device has a holding function that can be switched on and off.

15. A device for holding a substrate in an exposure system in which the substrate is positioned on a table movable in the X and Y coordinates of an X, Y plane and which, between a table surface and the substrate, provides a metering assembly to adjust the distance and to align the substrate in relation to an exposure optics, from where a corpuscular radiation is directed right-angled onto a substrate surface, corresponding to the Z coordinate, comprising:

a first mounting plate, aligned parallel to the X, Y plane, connected directly to the table in a direction to the exposure optics;

a second mounting plate, aligned parallel to the X, Y plane, connected to the first mounting plate in a direction to the exposure optics, and having a bearing plane for the substrate on a side facing the exposure optics; and at least one holding device between the first and second mounting plates configured to connect the first mounting plate to the second mounting plate.

16. An exposure system for exposing a substrate, comprising:

an exposure optics configured to direct radiation onto the substrate in a Z-coordinate direction perpendicular to a surface of the substrate;

a table, movable in the X and Y coordinates of an X, Y plane, configured to support the substrate;

a metering assembly, provided between the substrate and a surface of the table, configured to align the substrate and adjust its distance in relation to the exposure optics;

a first mounting plate, aligned parallel to the X, Y plane, connected directly to the table in a direction to the exposure optics;

a second mounting plate, aligned parallel to the X, Y plane, connected to the first mounting plate in a direction to the exposure optics, and having a bearing plane for the substrate on a side facing the exposure optics; and at least one holding device between the first and second mounting plates configured to connect the first mounting plate to the second mounting plate.

* * * * *